(12) United States Patent
Heimann

(10) Patent No.: US 8,168,908 B2
(45) Date of Patent: May 1, 2012

(54) CAPACITIVE TOUCH SWITCH

(75) Inventor: Uwe Heimann, Wangen (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 741 days.

(21) Appl. No.: 12/257,461

(22) Filed: Oct. 24, 2008

(65) Prior Publication Data

US 2009/0107829 A1  Apr. 30, 2009

(30) Foreign Application Priority Data

Oct. 24, 2007  (DE) .......................... 10 2007 050 654

(51) Int. Cl.
*H03K 17/975* (2006.01)
(52) U.S. Cl. ...................................... 200/600
(58) Field of Classification Search .................. 200/600, 200/511, 5 A; 345/173; 341/33; 178/18.06
See application file for complete search history.

(56) References Cited

U.S. PATENT DOCUMENTS

| | | | |
|---|---|---|---|
| 4,046,991 A | 9/1977 | Sefton et al. | |
| 4,304,976 A * | 12/1981 | Gottbreht et al. | 219/702 |
| 4,543,564 A | 9/1985 | Audoin et al. | |
| 7,232,973 B2 | 6/2007 | Kaps et al. | |
| 2006/0131159 A1* | 6/2006 | Kaps et al. | 200/600 |
| 2007/0103451 A1* | 5/2007 | Heimann et al. | 345/173 |

FOREIGN PATENT DOCUMENTS

| | | |
|---|---|---|
| DE | 32 45 803 A1 | 6/1984 |
| DE | 10 2004 026 836 A1 | 12/2005 |
| DE | 10 2004 060 846 A1 | 6/2006 |
| DE | 10 2005 053 792 A1 | 5/2007 |
| EP | 0 062 572 B1 | 10/1982 |
| EP | 1732224 A1 | 12/2006 |
| EP | 1786107 A1 | 5/2007 |
| FR | 2503494 A1 | 10/1982 |
| FR | 2 704 332 A1 | 10/1994 |

* cited by examiner

*Primary Examiner* — Vanessa Girardi
(74) *Attorney, Agent, or Firm* — Laurence A. Greenberg; Werner H. Stemer; Ralph E. Locher

(57) ABSTRACT

A capacitive touch switch for an operator control panel of an electrical domestic appliance includes a panel, a sensor area disposed in the panel, a printed circuit board disposed at a distance behind the panel, and a capacitive sensor element which is disposed between the panel and the printed circuit board, is in electrically conductive contact with the printed circuit board and is associated with the sensor area in the panel at a distance from the sensor area. The sensor area is formed by a plate of metal material, and a non-conductive insulating body is disposed between the plate and the capacitive sensor element.

15 Claims, 2 Drawing Sheets

CAPACITIVE TOUCH SWITCH

CROSS-REFERENCE TO RELATED APPLICATION

This application claims the priority, under 35 U.S.C. §119, of German Patent Application DE 10 2007 050 654.8, filed Oct. 24, 2007; the prior application is herewith incorporated by reference in its entirety.

BACKGROUND OF THE INVENTION

Field of the Invention

The present invention relates to a capacitive touch switch, including a panel, a sensor area disposed in the panel, a printed circuit board disposed at a distance behind the panel, and a capacitive sensor element which is disposed between the panel and the printed circuit board, is in electrically conductive contact with the printed circuit board and is associated with the sensor area in the panel at a distance from the sensor area.

Touch switches which trigger a certain switching operation simply by a user touching them are being used ever more frequently in many electrical appliances, in particular even in domestic appliances such as cookers, stoves, ranges, ovens, cook tops, microwave ovens, dishwashers, washing machines and the like. In the case of a capacitive touch switch, a capacitive sensor element together with the finger of a user, through a touch panel acting as a dielectric, forms a capacitance which is variable depending on operation of the touch switch, that is to say a touch panel associated with the capacitive sensor element being touched or not being touched. The change in capacitance of the capacitive sensor element, due to it being touched by the user, has a corresponding effect on an output signal from the sensor circuit, and that is correspondingly evaluated by a connected evaluation circuit as operation of the capacitive touch switch. Such a capacitive touch switch is known, for example, from German Published, Non-Prosecuted Patent Application DE 32 45 803 A1.

Furthermore, German Published, Non-Prosecuted Patent Application DE 10 2005 053 792 A1, corresponding to U.S. Patent Application Publication No. US 2007/0103451 A1, owned by the corporate assignee of the instant application, discloses a capacitive touch switch of that type in which the capacitive sensor element has a compression spring formed of electrically conductive material and a contact element formed of an electrically conductive material. The contact element is disposed on that side of the compression spring which faces the touch panel and is in electrically conductive contact with the compression spring. The compression spring, which is supported against the printed circuit board and the contact element, ensures reliable contact between the contact element of the sensor element and the lower face of the touch panel, as a result of which the functionality of the capacitive touch switch is improved even in the event of temperature changes, aging processes of the components, tolerances and positional inaccuracies of the components and the like.

In conventional capacitive touch switches, it is customary for the sensor area of the operator control panel, which sensor area is touched by the user in order to operate the capacitive touch switch, to use a metallized plastic surface, a plastic surface with a metallization on that side which faces the sensor element, a plastic surface with a metal plate on that side which faces the sensor element, or the like.

SUMMARY OF THE INVENTION

It is accordingly an object of the invention to provide a capacitive touch switch, which overcomes the hereinafore-mentioned disadvantages of the heretofore-known devices of this general type and which provides user-friendly operator control.

With the foregoing and other objects in view there is provided, in accordance with the invention, a capacitive touch switch, comprising a panel, a sensor area formed of a plate of metal material disposed in the panel, a printed circuit board disposed at a distance behind the panel, and a capacitive sensor element. The capacitive sensor element is disposed between the panel and the printed circuit board, is in electrically conductive contact with the printed circuit board and is associated with the plate in the panel at a distance from the plate. A non-conductive insulating body is disposed between the plate and the capacitive sensor element.

Since the sensor area is formed by a plate formed of a metal material, the user, when touching the sensor area, in contrast to the above-described conventional touch switches, experiences a real feeling of metal which has been found from experience to be pleasant and therefore provides user-friendly operator control. In order to provide the dielectric, which is required for the capacitive touch switch, between the sensor element and the finger of a user, an insulating body is disposed between the plate and the capacitive sensor element according to the invention.

In accordance with another feature of the invention, when the capacitive touch switch constructed in this way is used in conjunction with a panel formed of a metal material, it is necessary to additionally place an electrically insulating element between the plate and the panel.

In accordance with a further feature of the invention, in this case, the electrically insulating element can be formed, for example, of a non-conductive plastic, be contrasted with the panel and/or the plate in terms of color, and/or protrude from the panel in the direction of the user side.

In accordance with an added feature of the invention, the electrically insulating element is formed of a transparent material, and at least one lighting device (for example a light-emitting diode), which is associated with the electrically insulating element, is provided on the circuit board. In this case, a light guide element is preferably provided between the electrically insulating element and the at least one lighting device, and it is possible for the light guide element and the insulating body to be of integral or one-piece construction. With this construction of the touch switch, the electrically insulating element can be illuminated, in order to show the user the position of the sensor area and/or to indicate to the user the current switching state of the touch switch.

In accordance with an additional feature of the invention, if the panel is formed of a plastic, that is to say an electrically non-conductive material, the plate is alternatively simply inserted into the panel or placed onto the panel.

In accordance with yet another feature of the invention, the panel is at least partly formed of a transparent material in the vicinity of the plate and at least one lighting device is provided on the circuit board, with a light guide element preferably being provided between the panel and the at least one lighting device. With this construction of the touch switch, the area of the panel immediately surrounding the sensor area can be illuminated, in order to show the user the position of the sensor area and/or to indicate to the user the current switching state of the touch switch.

In accordance with yet a further feature of the invention, the plate of the capacitive touch switch of one of the two above variants can have an aperture, and a lighting device which is associated with the aperture can be provided on the circuit board, with a light guide element, which is preferably formed integrally or in one piece with the insulating body, preferably being provided between the aperture and the lighting device. With this construction of the touch switch, the sensor area itself can have a light mark in order to show the user, for example, the position of the sensor area and/or to indicate to the user the current switching state of the touch switch.

In accordance with yet an added feature of the invention, the capacitive sensor element of the touch switch according to the invention can be constructed in the manner described, for example, in the above-mentioned German Published, Non-Prosecuted Patent Application DE 10 2005 053 792 A1, corresponding to U.S. Patent Application Publication No. US 2007/0103451 A1, owned by the corporate assignee of the instant application.

In accordance with a concomitant feature of the invention, in particular, the capacitive sensor element can have a compression spring formed of an electrically conductive material and a contact element formed of an electrically conductive material. The contact element is disposed on that side of the compression spring which faces the sensor area and is in electrically conductive contact with the compression spring. In addition, a further contact element for making electrical contact with the compression spring can be provided on the printed circuit board, or the capacitive sensor element can also have, on its side which faces the printed circuit board, a further contact element for making electrical contact with the printed circuit board.

Other features which are considered as characteristic for the invention are set forth in the appended claims.

Although the invention is illustrated and described herein as embodied in a capacitive touch switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
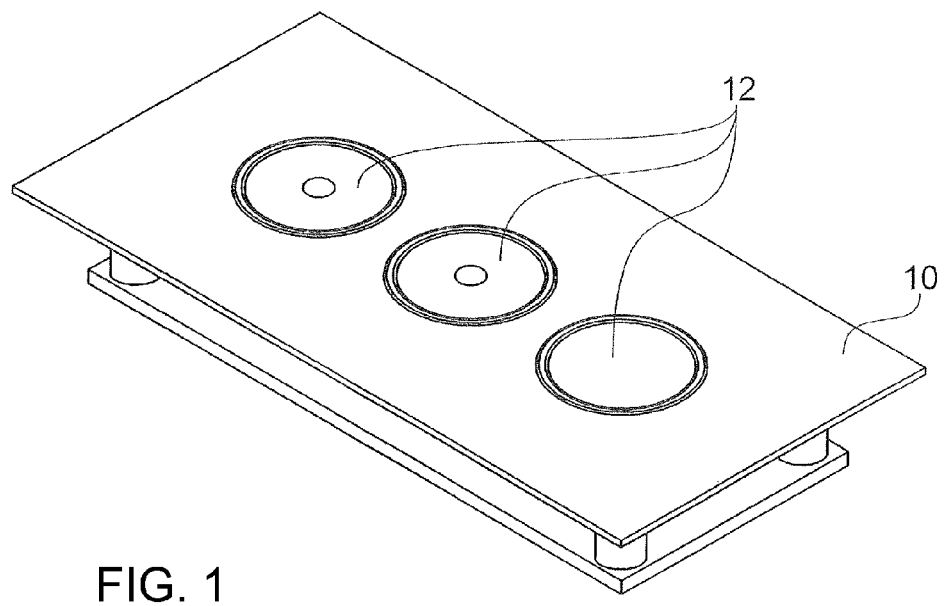
FIG. 1 is a diagrammatic, perspective view of an operator control panel having a plurality of capacitive touch switches according to the present invention.

Referring now to the figures of the drawings in detail and first, particularly, to FIG. 1 thereof, there is seen a diagrammatic, perspective view of an operator control panel of an electrical appliance, in particular a domestic electrical appliance (cooker, stove, range, oven, cook top, microwave oven, dishwasher, washing machine or the like).

Reference numeral 10 denotes a panel which faces a user, is formed of a metal material and has a plurality (in this exemplary embodiment three) of sensor areas 12 disposed therein, which are to be operated by the user of a capacitive touch switch in each case for setting programs, functions, parameters etc. of the respective domestic appliance. According to the invention, these sensor areas 12 are in each case formed by a plate or disc of a metal material (which is also referred to as a metal plate for short in the text which follows), as explained in greater detail below.

More details of the construction of the capacitive touch switches of the operator control panel of FIG. 1 will now be explained with reference to FIGS. 2 and 3.

A printed circuit board or circuit board 14, which is fitted with various non-illustrated electrical components and contains, in particular, a sensor circuit and an evaluation circuit for the capacitive touch switch, is disposed at a specific distance behind the panel 10. Capacitive sensor elements 16 of the capacitive touch switches are disposed between this circuit board 14 and the panel 10 so as to correspond with the sensor areas 12.

The capacitive sensor elements 16 of these touch switches substantially include a compression spring 18 of an electrically conductive material, a disc-like contact element 20 of an electrically conductive material which is disposed on that side of the compression spring 18 (at the top in FIG. 2) which faces the sensor area 12, and a further contact element 22 of an electrically conductive material which is formed on the printed circuit board 14 in the form of a contact area. The contact element 20 and the further contact element 22 are each in electrically conductive contact with a compression spring 18 which is supported against these two contact elements 20, 22. In this way, sufficiently good contact of the sensor element is always ensured irrespective of temperature fluctuations, component tolerances, positional inaccuracies and the like, as a result of which the functionality of the capacitive touch switch is ensured.

Instead of the contact area 22 on the circuit board 14 acting as a further contact element, the further contact element can also be formed, analogously to the contact element 20, as a disc of an electrically conductive material which is connected to the compression spring 18. It goes without saying that the shape and size of the contact elements 20, 22 are not especially restricted but can be in each case optimally matched to the sensor area 12 and the circuit board 14.

Since, according to the invention, the sensor area 12 of the capacitive touch switch is formed by a plate 24 of a metal material (which is also referred to as a metal plate 24 for short in the text which follows) and the panel 10 is likewise of a metal material, it is necessary to place an electrically insulating element 26 between the metal plate 24 of the sensor area 12 and the panel 10. In the case of a disc-like metal plate 24, this electrically insulating element 26 is formed as an insulating ring.

The electrically insulating element 26 is formed, for example, of a non-conductive plastic which is distinguished from the panel 10 and/or the metal plate 24 in terms of color for the purpose of improved identification of the sensor area 12 within the panel 10. In addition, the electrically insulating element 26 can protrude from the panel 10 in the direction of the user side, that is to say it can be raised, in order to increase the size of the insulating path. Overall, the sensor area 12 in the panel 10 is clearly marked for the user by the electrically insulating element 26.

Figure 3:
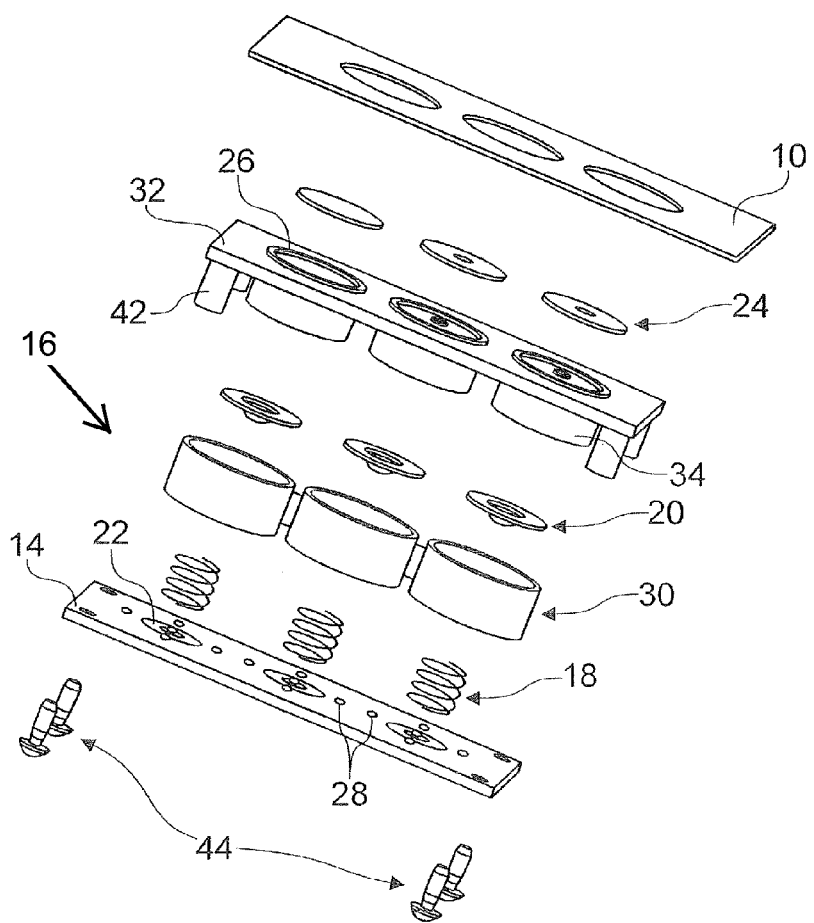
FIG. 3 is an exploded, perspective view of the capacitive touch switch of FIG. 1.
Figure 2:
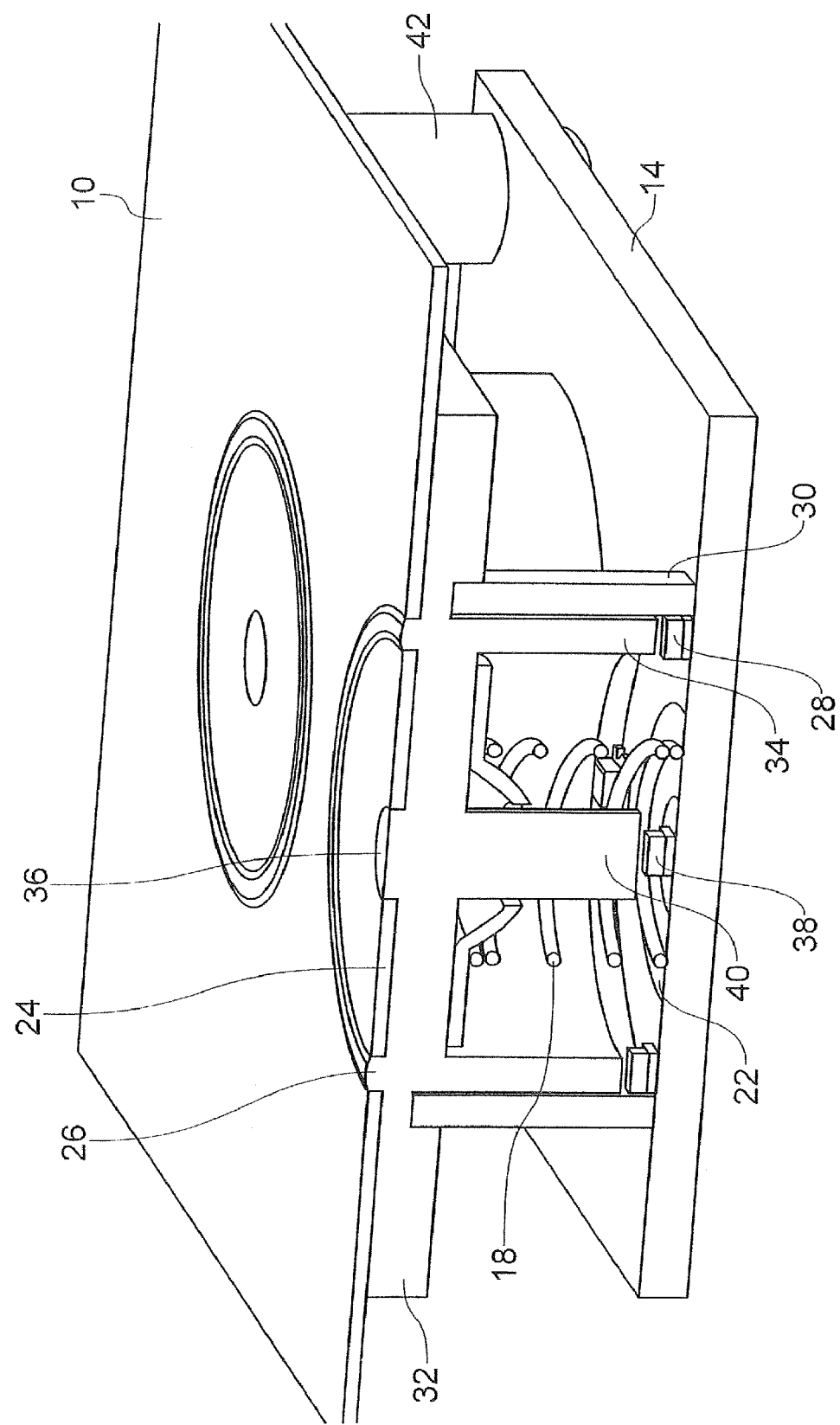
FIG. 2 is a partly-sectional, side-perspective view of the capacitive touch switch of FIG. 1.

In a special embodiment, as is illustrated in FIGS. 2 and 3, the electrically insulating element 26 can be formed of a transparent material. In this case, at least one lighting device (for example a light-emitting diode) 28, which is associated with this electrically insulating element 26, is provided on the circuit board 14. In addition, it is advantageous to place the capacitive sensor element 16 and the at least one lighting device 28 on the circuit board 14 within an opaque separating body 30 which is, for example, annular and forms a beam path for the light, that is emitted by the at least one lighting device 28, to the electrically insulating element 26. With this construction, the electrically insulating element 26 can be illuminated with the aid of the lighting device 28, in order to show the user the position of the sensor area 12 and, if desired, to indicate to the user the current switching state of the capacitive touch switch in accordance with the color of the lighting.

Since the sensor area 12 of the capacitive touch switch, as mentioned above, is formed by the metal plate 24 in order to provide the user with a pleasant metal feeling when he or she touches the sensor area 12, this metal plate 24 and the contact element 20 of the capacitive sensor element 16 also have to be separated from one another through the use of a dielectric, so that these two elements function as the electrodes of a capacitor having a capacitance value which changes depending on the sensor area 12 being touched or not being touched by a user.

In the exemplary embodiment, this insulating dielectric is formed by an insulating body 32, for example of a non-conductive plastic. The insulating body 32 is, for example, plate-shaped and is disposed directly on the rear face of the panel 10.

If the electrically insulating element 26 is formed from a transparent material, it is advantageous to provide a light guide element 34 between this element 26 and the at least one associated lighting device 28. This light guide element 34 is preferably formed integrally or in one piece with the insulating body 32 and extends in an annular manner within the opaque separating body 30.

As is illustrated in FIG. 2 in particular, the metal plate 24 can additionally be provided with a (generally central) aperture 36, and a further lighting device (for example a light-emitting diode) 38 which is associated with the aperture 36 can be mounted on the circuit board 14. A further light guide element 40, which is advantageously formed integrally or in one piece with the insulating body 32, preferably extends between the aperture 36 and the further lighting device 38. In this way, the position of the sensor area 12 within the panel 10 can also be shown to the user and the switching state of the touch switch can, if desired, be indicated to the user in accordance with the color of the lighting.

The illuminated aperture 36 in the metal plate 24 can be provided either as an alternative or in addition to the illuminated insulating ring 26. If both types of lighting are present, the illuminated insulating ring 26 can, for example, mark the sensor area 12 and the illuminated aperture 36 in the metal plate 24 can indicate to the user the switching state of the capacitive touch switch.

As is indicated in FIGS. 2 and 3, a plurality of spacer sleeves 42, which are preferably formed integrally or in one piece with the insulating body 32, are provided on that side of the insulating body 32 which faces the circuit board 14. These spacer sleeves 42 are used to maintain a constant distance between the circuit board 14 and the insulating body 32 or the panel 10 and also to fix the entire configuration through the use of fixing screws 44 which are screwed into the spacer sleeves 42 through corresponding holes in the circuit board 14.

While the present invention has been fully described above with reference to a preferred exemplary embodiment on the basis of the figures, it is self-evident to a person skilled in the art that various modifications and variants can be made, without departing from the scope of protection defined by the claims.

For example, the capacitive sensor element 16 is not restricted to the sensor element illustrated in FIG. 2. The capacitive sensor element 16 is preferably constructed like the sensor element disclosed in German Published, Non-Prosecuted Patent Application DE 10 2005 053 792 A1, corresponding to U.S. Patent Application Publication No. US 2007/0103451 A1, with reference hereby being made to the content of that document which is incorporated by reference herein, but can also assume another physical form.

Furthermore, the present invention was described above by using an exemplary embodiment in which the panel 10 is formed of a metal material. As an alternative, the present invention can also be applied to capacitive touch switches with a panel formed of a non-conductive material, for example plastic. In this case, the electrically insulating element 26 can, of course, be dispensed with, since its function is already integrated in the panel 10. In this case, the metal plate 24 is either placed on the panel 10 or integrated in that panel. All of the further features described above can analogously be transferred to a touch switch of this type too.

The invention claimed is:

1. A capacitive touch switch, comprising:
a panel formed of a metal material;
a sensor area formed of a plate of metal material disposed in said panel;
an electrically insulating element disposed between said plate and said panel;
a printed circuit board disposed at a distance behind said panel;
a capacitive sensor element being disposed between said panel and said printed circuit board, in electrically conductive contact with said printed circuit board and associated with said plate in said panel at a distance from said plate; and
a non-conductive insulating body disposed between said plate and said capacitive sensor element.

2. The capacitive touch switch according to claim 1, wherein said electrically insulating element is formed of a non-conductive plastic.

3. The capacitive touch switch according to claim 1, wherein said electrically insulating element is distinguished from at least one of said panel or said plate by color.

4. The capacitive touch switch according to claim 1, wherein said electrically insulating element protrudes from said panel in direction of a user side.

5. The capacitive touch switch according to claim 1, wherein said electrically insulating element is formed of a transparent material, and at least one lighting device, associated with said electrically insulating element, is disposed on said printed circuit board.

6. The capacitive touch switch according to claim 5, which further comprises a light guide element disposed between said electrically insulating element and said at least one lighting device.

7. The capacitive touch switch according to claim 6, wherein said light guide element and said insulating body are integrally constructed.

8. The capacitive touch switch according to claim 6, wherein said light guide element and said insulating body are formed in one piece.

9. The capacitive touch switch according to claim 1, wherein said capacitive sensor element includes a compression spring formed of an electrically conductive material and a contact element formed of an electrically conductive material, and said contact element is disposed on a side of said compression spring facing said sensor area and is in electrically conductive contact with said compression spring.

10. The capacitive touch switch according to claim 9, which further comprises a contact area disposed on said printed circuit board for making electrical contact with said compression spring.

11. The capacitive touch switch according to claim 9, wherein said capacitive sensor element has a side facing said printed circuit board, and a further contact element is disposed at said side for making electrical contact with said printed circuit board.

12. The capacitive touch switch according to claim 1, wherein said plate has an aperture, and a lighting device is associated with said aperture and disposed on said printed circuit board.

13. The capacitive touch switch according to claim 12, which further comprises a light guide element disposed between said aperture and said lighting device.

14. The capacitive touch switch according to claim 13, wherein said light guide element and said insulating body are integrally constructed.

15. The capacitive touch switch according to claim 13, wherein said light guide element and said insulating body are formed in one piece.

* * * * *